United States Patent [19]
Battey et al.

[11] Patent Number: 4,767,661
[45] Date of Patent: * Aug. 30, 1988

[54] COPPER ETCHING PROCESS AND PRODUCT

[75] Inventors: James F. Battey, Los Altos; Norvell J. Nelson, Palo Alto; Daniel J. Barnett, San Jose, all of Calif.

[73] Assignee: PSI Star, Fremont, Calif.

[*] Notice: The portion of the term of this patent subsequent to Sep. 22, 2004 has been disclaimed.

[21] Appl. No.: 84,632

[22] Filed: Aug. 11, 1987

Related U.S. Application Data

[63] Continuation-in-part of Ser. No. 27,740, Mar. 19, 1987, which is a continuation-in-part of Ser. No. 907,078, Sep. 16, 1987, Pat. No. 4,695,348.

[51] Int. Cl.$^4$ .......................... B44C 1/22; C23F 1/02
[52] U.S. Cl. .................................. 428/209; 156/150; 156/630; 156/634; 156/647; 156/659.1; 156/656; 156/666; 156/902; 29/846; 252/79.2; 252/79.4; 428/457; 428/601
[58] Field of Search .............. 156/150, 151, 647, 656, 156/659.1, 666, 901, 902, 630, 634; 29/846; 428/601, 457, 209; 252/79.4, 79.2; 174/68.5

[56] References Cited

U.S. PATENT DOCUMENTS 4,695,348  9/1987  Battey et al. .................. 156/647

Primary Examiner—William A. Powell
Attorney, Agent, or Firm—Flehr, Hohbach, Test, Albritton & Herbert

[57] ABSTRACT

Copper etching process and product particularly suitable for use in the manufacture of printed circuit boards. The copper is etched in a liquid etchant, and the crystal structure of the copper is selected and carefully controlled to provide an anisotropic etch and a vertical-to-lateral etching ratio greater than 1:1. In one disclosed embodiment, the etching solution contains nitric acid, copper nitrate or sulfuric acid, a polymer and a surfactant, and the copper has a top surface crystal structure with predominantly (111) orientation. In another disclosed embodiment, the etching solution contains hydrogen peroxide and sulfuric acid, and the copper foil has a top surface crystal structure with predominantly (311) and (511) orientations and/or (111) orientation. A printed circuit board manufactured in accordance with the invention has a copper foil with a crystal structure selected to provide anisotropic etching and a vertical-to-lateral etching ratio greater than 1:1 with a given etching solution bonded to a substrate, with portions of the copper foil being etched away by the etching solution to form the desired foil pattern.

66 Claims, No Drawings

COPPER ETCHING PROCESS AND PRODUCT

This is a continuation-in-part of Ser. No. 027,740, filed Mar. 19, 1987, which is a continuation-in-part of Ser. No. 907,078, filed Sept. 16, 1986, U.S. Pat. No. 4,695,348.

This invention pertains generally to the etching of copper, and more particularly to a copper etching process and product particularly suitable for use in the manufacture of printed circuit boards.

Copper foil used in the manufacture of electronic circuit boards is electrodeposited on metal surfaces from solution. Thicker foils ($\frac{1}{2}$, 1 and 2 ounces per square foot) are deposited on chromium plated drums and peeled off. The thinner foils ($\frac{1}{8}$ and $\frac{1}{4}$ ounce per square foot) are deposited on an aluminum carrier foil backing which is not removed until just prior to use. The copper foil is protected by the carrier foil during lamination to a substrate fabricated of an electrically insulative material such as fiberglass and epoxy.

At the present time, most etching of copper on two-sided or multilayer circuit boards is done with either alkaline-ammonia based etchants or hydrogen peroxide-sulfuric acid etchants. Each of these processes has certain limitations and disadvantages. For general use, the alkaline-ammonia process is relatively fast, reasonably tolerant of metal resists and some dry film resists, and has a substantial copper carrying capacity. However, it does not work well with fine line geometries, the dissolved copper is difficult to recover, and fumes from the ammonia present a problem. The hydrogen peroxide-sulfuric acid process is much cleaner, and the dissolved copper is readily recovered as a marketable product. However, the process is relatively slow, and it requires substantial cooling for stability control, due to the auto-decomposition reaction of hydrogen peroxide. In addition, both the performance of the process and the decomposition of the peroxide are very sensitive to trace impurities.

In each of these processes, there is a tendency for the copper to be removed more quickly in areas where fine lines are present than in larger open areas. This results in undercutting of the lines while the larger areas are being cleared of copper. Neither process is truly anisotropic.

U.S. Pat. No. 4,497,687 describes an improved process for anisotropically etching copper foil in the manufacture of printed circuit boards. This process utilizes an aqueous solution of nitric acid as an etchant, and it overcomes many of the problems of the other processes discussed above. U.S. Pat. No. 4,545,850 discloses a somewhat similar process in which the etching solution is regenerated by adding sulfuric acid. Even with these improved processes, some instances have been encountered in which there has been inexplicable lateral etching or undercutting of the copper.

It is in general an object of the invention to provide a new and improved copper etching process and product in which lateral etching and undercutting are reduced.

Another object of the invention is to provide an etching process and product of the above character in which anisotropic etching is achieved consistently.

These and other objects are achieved in accordance with the invention by etching the copper in an aqueous solution and carefully controlling the crystal structure of the copper to provide anisotropic etching with a vertical-to-lateral etching ratio greater than 1:1. In one disclosed embodiment, the etching solution contains nitric acid, copper nitrate or sulfuric acid, a polymer and a surfactant, and the copper has a top surface crystal structure whose Miller indices are predominantly (111). In another disclosed embodiment, the etching solution contains hydrogen peroxide and sulfuric acid, and the copper foil has a top surface crystal structure with predominantly (311) and (511) orientations and/or (111) orientation. A printed circuit board manufactured in accordance with the invention has a copper foil with a crystal structure selected to provide anisotropic etching and a vertical-to-lateral etching ratio greater than 1:1 with a given etching solution, with portions of the copper foil being etched away by the etching solution to form the desired foil pattern.

The electrodeposited foil used in circuit boards grows in columnar structure with axes perpendicular to the surface of the foil. The height of the columns is typically on the order of 1 mil, and the width is on the order of a few tenths of a mil. The columns are believed to be composed of many single crystals, hence the columnar structure itself is polycrystalline. It has been found that when the crystals at the surface have a predominantly favorable orientation, the etching of the copper foil proceeds at a faster rate perpendicular to the foil surface than parallel to the surface. This is desirable because it reduces undercutting or etching of the copper beneath the photoresist or other mask employed to define the etch pattern. In addition, the etch is anisotropic in that the side walls of the etch pattern are nearly perpendicular to the top surface or plane of the copper foil. These advantages make it possible to etch circuit boards with fine geometry and controlled geometry of higher quality and higher yield than an etch which is isotropic and removes material in all directions at the same rate.

The nitric acid etching chemistry employed in one embodiment of the invention is disclosed in detail in U.S. Pat. Nos. 4,497,687 and 4,545,850. Nitric acid reacts with copper according to the relationship

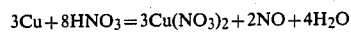
$$3Cu + 8HNO_3 = 3Cu(NO_3)_2 + 2NO + 4H_2O$$

with the nitric acid serving both as an oxidant and as an anion source for the dissolved copper. The dissolved copper is removed by adding sulfuric acid to precipitate the copper according to the relationship

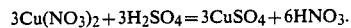
$$3Cu(NO_3)_2 + 3H_2SO_4 = 3CuSO_4 + 6HNO_3.$$

To protect the etch resist and the substrate board from attack by the nitric acid, either copper nitrate or sulfuric acid is included in the etching solution. When sulfuric acid is employed, the consumption of nitric acid is reduced, and the reaction proceeds according to the relationship

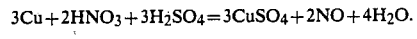
$$3Cu + 2HNO_3 + 3H_2SO_4 = 3CuSO_4 + 2NO + 4H_2O.$$

Copper is removed as the sulfate pentahydrate according to the relationship

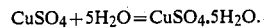
$$CuSO_4 + 5H_2O = CuSO_4.5H_2O.$$

The Copper nitrate or sulfuric acid increases the reactivity of nitric acid toward copper such that reasonable reaction rates can be achieved with much lower concentrations of nitric acid than would otherwise be required. Thus, the amount of nitric acid can be kept to levels which do not react with the substrates or organic resists. Certain metal resists can also be utilized with these etchants, including tin, nickel and alloys thereof. A polymer is included in the etching solution to control the surface reaction rate and to enhance the anisotropy of the etch. One suitable polymer is a polyacrylamide which is soluble in water and has a high molecular weight. The amount of polymer employed is on the order of 0.05% (volume) of the solution. Suitable polyacrylamides include Dow Separan CP-7HS (a high molecular weight cationic polymer), Hercules Reten 520 (a high molecular weight neutral polyacrylamide), and Dow Separan NP-10 (a high molecular weight slightly anionic polyacrylamide).

A surfactant is also included in the etching solution to reduce surface tension and facilitate the movement of nitric oxide bubbles from the surface of the copper. The nitric oxide gas is generated during the etching process, and the surfactants serve to keep the bubble size small and prevent the bubbles from bridging between resist lines and blocking etching between the lines. Only a very small amount of surfactant is required, e.g. 0.1 to 0.2% (volume) of the etching solution. Suitable surfactants include fluorocarbon surfactants such as 3M's FC-100 (an amphoteric surfactant) and FC-135 (a cationic surfactant).

It has now been found that the anisotropy of the etch obtained with the nitric acid etchants is to some extent dependent upon the crystal structure of the copper foil. A crystal has a basic unit structure which is iterated time after time to fill once and only once the three dimensional space occupied by the crystal. In a cubic crystal such as copper, the crystal axes are perpendicular to one another as are the x, y, z axes of a Cartesian coordinate system. Further the unit distance along all three axes is the same.

Planes in a crystal are specified in terms of their Miller indices. The Miller indices are the reciprocal of the number of unit distances which the plane in question intercepts the x, y, z axes. Thus, the (111) plane intercepts all three axes at unit distance. The (200) plane intercepts the x axis at ½ a unit distance and is parallel to the y and z axes. Similarly the (220) plane intercepts the x and y axes at ½ a unit distance and is parallel to the z axis.

Identification of crystal planes parallel to the surface of copper foil used in our work has been done by Bragg analysis. In Bragg analysis, x-rays are impinged on the foil surface at various angles. When the reflected x-rays from the top plane of atoms have a path length which is an integral number of wavelengths shorter than the path length for the x-rays reflected from the second plane of atoms, the x-rays constructively interfere, and a maximum in intensity of reflected x-rays occur for this angle of incidence. From a knowledge of this angle and the wavelength of the x-rays, the distance between the planes of atoms can be determined. From this distance, the Miller indices of the plane of atoms parallel to the surface can be inferred. From symmetry considerations, x-ray reflections in a face-centered cubic crystal constructively interfere only from planes that have either all even or all odd Miller indices.

X-ray analysis of several boards with good anisotropy has yielded the following data in which the relative amounts of the different crystal orientations are expressed in terms of the relative intensities of the x-ray lines reflected from the various crystal planes:

| Sample | (111) | (200) | (220) | (311) | (331) | (420) |
|---|---|---|---|---|---|---|
| A | 70.0 | 19.0 | 6.0 | 5.0 | | |
| B | 73.6 | 18.4 | 4.0 | 4.0 | | |
| C | 57 | 21 | 9 | 8 | 3 | 2 |

X-ray analysis of several boards with lateral etching and undercutting has shown that these boards had the following crystal structures (percentages of x-ray line intensities):

| Sample | (111) | (200) | (220) | (311) | (331) | (420) |
|---|---|---|---|---|---|---|
| D | 56.0 | 15.0 | 22.0 | 7.0 | | |
| E | 55.5 | 8.2 | 30.7 | 5.6 | | |
| F | 44 | 8 | 32 | 7 | 6 | 3 |
| G | 43 | 8 | 34 | 7 | 5 | 3 |
| H | 43 | 13 | 28 | 9 | 5 | 2 |
| I | 35 | 15 | 21 | 15 | 7 | 7 |
| J | 34 | 18 | 16 | 17 | 6 | 9 |
| K | 33 | 15 | 19 | 16 | 8 | 9 |

From this data, it appears that good etching (a vertical to horizontal etch ratio, or etch factor, which is greater than 1:1) is obtained when the crystal orientation is predominantly (111). An etch factor of 2:1 can be obtained with crystal structures in which about 60% of the total line intensity produced by x-ray analysis of the structure is due to the (111) orientation. When about 50% of the line intensity is due to the (111) orientation intensity, the etch factor will be on the order of 1:1, and the etch will be isotropic. For an etch ratio on the order of 10:1, the (111) crystals in the top surface of the structure should produce about 70% of the line intensity. In each the crystal structure of the top surface should extend to the back side of the foil.

In the following example, the etch was anisotropic in that it had straight side walls, but the vertical-to-lateral etching ratio was about 2:1 and there was substantial removal of copper beneath the photoresist:

| Sample | (111) | (200) | (220) | (311) | (331) | (420) |
|---|---|---|---|---|---|---|
| L | 46 | 23 | 14 | | 12 | 2 |

In the examples given above (Samples A–L), the etching was done with an aqueous solution containing 3 liters of copper nitrate solution (density 1.45), 1 liter of 70% nitric acid, 100 ml of a 2% solution of Separan CP-7HS, and 5 ml of FC-100.

It has also been found that the anisotropy and the vertical-to-lateral etching ratio obtained with a hydrogen peroxide-sulfuric acid etching solution can be improved by including a polymer and a surfactant in the solution and by proper selection of the crystal structure of the copper. The following table shows the relative etch rates obtained with single crystal copper slugs and an etching solution containing 600 ml of 50% (volume) sulfuric acid, 210 ml of 50% (volume) hydrogen peroxide, 60 ml of sodium molybdate solution (0.5 g/ml), 55 ml of phenol sulfonic acid solution (Ferro PSA 1000) and 2.075 liters of deionized water, with the additives indicated:

| Additive(s) | (111) | (110) | (100) | (210) | (211) | (311) | (511) |
|---|---|---|---|---|---|---|---|
| Separan CP7 | 1.0 | .97 | .69 | 1.0 | 1.1 | 18.4 | |
| Separan CP7 | 1.0 | 1.1 | .63 | 1.5 | 2.2 | 16.2 | |

-continued

| Additive(s) | (111) | (110) | (100) | (210) | (211) | (311) | (511) |
|---|---|---|---|---|---|---|---|
| Separan CP7 (1 day older) | 1.0 | | 1.8 | | | 13.0 | 12.2 |
| Reten 520 | 1.0 | 2.1 | 5.7 | 2.4 | 3.1 | 9.1 | 9.8 |
| Reten 520 and Dimethylamine | 1.0 | 2.0 | 3.4 | | | 10.9 | |

From this data, it is believed that if copper foils with predominantly (311) and (511) top surface crystal orientations were prepared, the top surface planes will etch much more rapidly than the side planes in a hydrogen peroxidesulfuric acid solution with a variety of different additives. The etch factors, i.e. the vertical-to-lateral etching ratios, would vary from about 5:1 to about 20:1, depending upon the additives. It has also been found that good results are obtained when copper foil etched in a hydrogen peroxide-sulfuric acid solution has predominently (111) orientation.

The following examples illustrate the manner in which the addition of a polymer and a surfactant enhance the performance of the hydrogen peroxide-sulfuric acid etching process with respect to line loss and line shape. In each of these examples, the sample etched consisted of a copper foil having a weight of ¼ ounce per square foot, with an etch pattern defined by a bright tin etch resist on the surface of the copper.

EXAMPLE 1

The ¼ ounce base sample pattern plated with tin etch resist was etched in a solution of 700 ml deionized water, 1000 ml MacDermid's Circu-Etch 87, 100 ml MacDermid's Circu-Etch 84 and 250 ml 50% hydrogen peroxide for approximately 70 seconds. A 3 mil line and space pattern 1½ mil thick had notched and rough side walls with some undercutting of the metal etch resist.

EXAMPLE 2

A similar sample was etched in a 3 liter solution of 190 ml sulfuric acid, 70 ml 85% phosphoric acid, 4.5 gm 5-sulfosalicylic acid, 350 gm copper sulfate pentahydrate, 300 ml 50% hydrogen peroxide, 100 ml 2% Reten 520 (a Hercules non-ionic polyacrylamide), 3 ml Varion H.C. (a Sherex surfactant) and deionized water for approximately 4½ minutes. This yielded a 4 mil line and space structure 1½ mil high with straight side walls and no perceptible undercutting or loss of the copper lines.

EXAMPLE 3

500 ml of 70% methanesulfonic acid was added to the etching solution of Example 2. A ¼ ounce base copper sample pattern plated with tin etch resist was etched in this solution for approximately 3¾ minutes. A 4 mil line and space structure 2 mil thick with straight side walls and no perceptible line loss was produced.

These examples show that the addition of a polyacrylamide substantially enhances the results obtained with a hydrogen peroxide-sulfuric acid solution in the etching of copper. With the sample etched in Examples 2 and 3, the etch time can be reduced somewhat by the addition of 100 ml of a 30% solution of 6-aminocaprylic acid to the etching solution.

It is apparent from the foregoing that a new and improved copper etching process and product have been provided. While only certain presently preferred embodiments have been described in detail, as will be apparent to those familiar with the art, certain changes and modifications can be made without departing from the scope of the invention as defined by the following claims.

We claim:

1. In a process utilizing a liquid etchant for manufacturing a circuit board, the steps of: selecting a copper foil having a top surface crystal structure which is etched anisotropically and with a vertical-to-lateral etching ratio greater than 1:1 by the liquid etchant, bonding the copper foil to a substrate, and exposing a portion of the copper foil to the liquid etchant to remove that portion of the foil from the substrate.

2. The process of claim 1 wherein the liquid etchant comprises an aqueous solution of nitric acid and copper nitrate or sulfuric acid with a polymer and a surfactant, and the copper foil is selected to have a top surface crystal structure with predominantly (111) orientation.

3. The process of claim 1 wherein the liquid etchant comprises an aqueous solution of hydrogen peroxide, sulfuric acid, a polymer and a surfactant, and the copper foil is selected to have a top surface crystal structure with predominantly (111) orientation.

4. A circuit board manufactured by the steps of: selecting a copper foil having a top surface crystal structure which is etched anisotropically and with a vertical-to-lateral etching ratio greater than 1:1 by a liquid etchant, bonding the copper foil to a substrate, and exposing a portion of the copper foil to the liquid etchant to remove that portion of the foil from the substrate.

5. The circuit board of claim 4 wherein the liquid etchant comprises an aqueous solution of nitric acid, copper nitrate or sulfuric acid, a polymer and a surfactant, and the copper foil is selected to have a top surface crystal structure with predominantly (111) orientation.

6. The circuit board of claim 4 wherein the liquid etchant comprises an aqueous solution of hydrogen peroxide, sulfuric acid, a polymer and a surfactant, and the copper foil is selected to have a top surface crystal structure with predominantly (111) orientation.

7. In a process for manufacturing a circuit board, the steps of: bonding a copper foil having a top surface crystal structure with predominantly (111) orientation to a substrate, and exposing a portion of the copper foil to an aqueous solution of nitric acid, a polymer and a surfactant to remove that portion of the foil from the substrate.

8. The process of claim 7 wherein the copper foil has enough (111) crystal orientation so that greater than 50% of the line intensity produced by Bragg x-ray analysis of the foil is due to the (111) orientation.

9. The process of claim 7 wherein the aqueous solution contains nitric acid, the polymer, copper nitrate or sulfuric acid, and the surfactant.

10. The process of claim 7 wherein the copper foil has a weight on the order of ½–2 ounces per square foot of surface area.

11. In a circuit board: a substrate, and a copper foil on one side of the substrate having a top surface crystal structure with predominantly (111) orientation, portions of the foil having been removed from the board by etching with an aqueous solution of nitric acid, a polymer and a surfactant.

12. The circuit board of claim 11 wherein the (111) orientation content of the copper foil is such that greater than 50% of the line intensity produced by Bragg x-ray analysis of the foil is due to the (111) orientation.

13. The circuit board of claim 11 wherein the aqueous solution contains nitric acid, the polymer, copper nitrate or sulfuric acid, and the surfactant.

14. The circuit board of claim 11 wherein the copper foil has a weight on the order of ⅛–2 ounces per square foot of surface area.

15. A circuit board manufactured by the steps of bonding a copper foil having a top surface crystal structure with predominantly (111) orientation to a substrate, and removing a portion of the copper foil from the substrate by etching with an aqueous solution of nitric acid, copper nitrate or sulfuric acid, a polymer and a surfactant.

16. The circuit board of claim 15 wherein the (111) crystal orientation content of the copper foil is such that at least 50% of the line intensity produced by x-ray analysis of the foil is due to the (111) orientation.

17. The circuit board of claim 15 wherein the aqueous solution contains nitric acid, the polymer, copper nitrate or sulfuric acid, and surfactant.

18. The circuit board of claim 15 wherein the copper foil has a weight on the order of ⅛–2 ounces per square foot of surface area.

19. A process of etching copper having a top surface crystal structure with predominantly (111) orientation with an aqueous solution of nitric acid, copper nitrate or sulfuric acid, a polymer and a surfactant.

20. The process of claim 19 wherein (111) crystal content of the copper is such that at least 50% of the line intensity produced by x-ray analysis of the copper is due to the (111) orientation.

21. The process of claim 20 wherein the aqueous solution contains nitric acid, the polymer, copper nitrate or sulfuric acid, and surfactant.

22. In a process for manufacturing a circuit board, the steps of: bonding a copper foil having a top surface crystal structure with predominantly (111) orientation to a substrate, and exposing a portion of the copper foil to a liquid etchant containing hydrogen peroxide, sulfuric acid, a polymer and a surfactant to remove that portion of the foil from the substrate.

23. In a circuit board: a substrate, and a copper foil on one side of the substrate having a top surface crystal structure with predominantly (111) orientation, portions of the copper foil having been removed from the board by etching with an aqueous solution containing hydrogen peroxide, sulfuric acid, a polymer and a surfactant.

24. A circuit board manufactured by the steps of: bonding a copper foil having a top surface crystal structure with predominantly (111) orientation to a substrate, and exposing a portion of the copper foil to a liquid etchant containing hydrogen peroxide, sulfuric acid, a polymer and a surfactant to remove that portion of the foil from the substrate.

25. The process of claim 1 wherein the liquid etchant comprises an aqueous solution of hydrogen peroxide, sulfuric acid, a polymer and a surfactant, and the copper foil is selected to have a top surface crystal structure with predominantly (311), (511) and (111) orientations.

26. The circuit board of claim 4 wherein the liquid etchant comprises an aqueous solution of hydrogen peroxide, sulfuric acid, a polymer and a surfactant, and the copper foil is selected to have a top surface crystal structure with predominantly (311), (511) and (111) orientations.

27. In a process for manufacturing a circuit board, the steps of: bonding a copper foil having a top surface crystal structure with predominantly (311), (511) and (111) orientations to a substrate, and exposing a portion of the copper foil to a liquid etchant containing hydrogen peroxide, sulfuric acid, a polymer and a surfactant to remove that portion of the foil from the substrate.

28. In a circuit board: a substrate, and a copper foil on one side of the substrate having a top surface crystal structure with predominantly (311), (511) and (111) orientations, portions of the copper foil having been removed from the board by etching with an aqueous solution containing hydrogen peroxide, sulfuric acid, a polymer and a surfactant.

29. A circuit board manufactured by the steps of: bonding a copper foil having a top surface crystal structure with predominantly (311), (511) and (111) orientations to a substrate, and exposing a portion of the copper foil to a liquid etchant containing hydrogen peroxide, sulfuric acid, a polymer and a surfactant to remove that portion of the foil from the substrate.

30. The process of claim 1 wherein the liquid etchant comprises an aqueous solution of hydrogen peroxide, sulfuric acid, a polymer and a surfactant, and the copper foil is selected to have a top surface crystal structure with predominantly (311) and (511) orientations.

31. The circuit board of claim 4 wherein the liquid etchant comprises an aqueous solution of hydrogen peroxide, sulfuric acid, a polymer and a surfactant, and the copper foil is selected to have a top surface crystal structure with predominantly (311) and (511) orientations.

32. In a process for manufacturing a circuit board, the steps of: bonding a copper foil having a top surface crystal structure with predominantly (311) and (511) orientatios to a substrate, and exposing a portion of the copper foil to a liquid etchant containing hydrogen peroxide, sulfuric acid, a polymer and a surfactant to remove that portion of the foil from the substrate.

33. In a circuit board: a substrate, and a copper foil on one side of the substrate having a top surface crystal structure with predominantly (311) and (511) orientations, portions of the copper foil having been removed from the board by etching with an aqueous solution containing hydrogen peroxide, sulfuric acid, a polymer and a surfactant.

34. A circuit board manufactured by the steps of: bonding a copper foil having a top surface crystal structure with predominantly (311) and (511) orientations to a substrate, and exposing a portion of the copper foil to a liquid etchant containing hydrogen peroxide, sulfuric acid, a polymer and a surfactant to remove that portion of the foil from the substrate.

35. The process of claim 1 wherein the liquid etchant comprises an aqueous solution of nitric acid and copper nitrate or sulfuric acid with polymer, and the copper foil is selected to have a top surface crystal structure with predominantly (111) orientation.

36. The process of claim 1 wherein the liquid etchant comprises an aqueous solution of hydrogen peroxide, sulfuric acid, and a polymer, and the copper foil is selected to have a top surface crystal structure with predominantly (111) orientation.

37. The circuit board of claim 4 wherein the liquid etchant comprises an aqeous solution of nitric acid, copper nitrate or sulfuric acid, and a polymer, and the copper foil is selected to have a top surface crystal structure with predominantly (111) orientation.

38. The circuit board of claim 4 wherein the liquid etchant comprises an aqueous solution of hydrogen peroxide, sulfuric acid, and a polymer, and a copper foil is selected to have a top surface crystal structure with predominantly (111) orientation.

39. In a process for manufacturing a circuit board, the steps of: bonding a copper foil having a top surface crystal structure with predominantly (111) orientation to a substrate, and exposing a portion of the copper foil to an aqueous solution of nitric acid and a polymer to remove that portion of the foil from the substrate.

40. The process of claim 39 wherein the copper foil has enough (111) crystal orientation so that greater than 50% of the line intensity produced by Bragg x-ray analysis of the foil is due to the (111) orientation.

41. The process of claim 39 wherein the aqueous solution contains nitric acid, the polymer, and copper nitrate or sulfuric acid.

42. The process of claim 7 wherein the copper foil has a weight on the order of ⅛–2 ounces per square foot of surface area.

43. In a circuit board: a substrate, and a copper foil on one side of the substrate having a top surface crystal structure with predominantly (111) orientation, portions of the foil having been removed from the board by etching with an aqueous solution of nitric acid and a polymer.

44. The circuit board of claim 43 wherein the (111) orientation content of the copper foil is such that greater than 50% of the foil is due to the (111) orientation.

45. The circuit board of claim 43 wherein the aqueous solution contains nitric acid, the polymer, and copper nitrate or sulfuric acid.

46. The circuit board of claim 43 wherein the copper foil has a weight on the order of ⅛–2 ounces per square foot of surface area.

47. A circuit board manufactured by the steps of bonding a copper foil having a top surface crystal structure with predominantly (111) orientation to a substrate, and removing a portion of the copper foil from the substrate by etching with an aqueous solution of nitric acid, copper nitrate or sulfuric acid, and a polymer.

48. The circuit board of claim 47 wherein the (111) crystal orientation content of the copper foil is such that at least 50% of the line intensity produced by x-ray analysis of the foil is due to the (111) orientation.

49. The circuit board of claim 47 wherein the aqueous solution contains nitric acid, the polymer, and copper nitrate or sulfuric acid.

50. The circuit board of claim 47 wherein the copper foil has a weight on the order of ⅛–2 ounces per square foot of surface area.

51. A process of etching copper having a top surface crystal structure with predominantly (111) orientation with an aqueous solution of nitric acid, copper nitrate or sulfuric acid and a polymer.

52. The process of claim 51 wherein (111) crystal content of the copper is such that at least 50% of the line intensity produced by x-ray analysis of the copper is due to the (111) orientation.

53. The process of claim 50 wherein the aqueous solution contains nitric acid, the polymer, and copper nitrate or sulfuric acid.

54. In a process for manufacturing a circuit board, the steps of: bonding a copper foil having a top surface crystal structure with predominantly (111) orientation to a substrate, and exposing a portion of the copper foil to a liquid etchant containing hydrogen peroxide, sulfuric acid, and a polymer to remove that portion of the foil from the substrate.

55. In a circuit board: a substrate, and a copper foil on one side of the substrate having a top surface crystal structure with predominantly (111) orientation, portions of the copper foil having been removed from the board by etching with an aqueous solution containing hydrogen peroxide, sulfuric acid and a polymer.

56. A circuit board manufactured by the steps of: bonding a copper foil having a top surface crystal structure with predominantly (111) orientation to a substrate, and exposing a portion of the copper foil to a liquid etchant containing hydrogen peroxide, sulfuric acid, and a polymer to remove that portion of the foil from the substrate.

57. The process of claim 1 wherein the liquid etchant comprises an aqueous solution of hydrogen peroxide, sulfuric acid, and a polymer, and the copper foil is selected to have a top surface crystal structure with predominantly (311), (511) and (111) orientations.

58. The circuit board of claim 4 wherein the liquid etchant comprises an aqueous solution of hydrogen peroxide, sulfuric acid, and a polymer, and the copper foil is selected to have a top surface crystal structure with predominantly (311), (511) and (111) orientations.

59. In a process for manufacturing a circuit board, the steps of: bonding a copper foil having a top surface crystal structure with predominantly (311), (511) and (111) orientations to a substrate, and exposing a portion of the copper foil to a liquid etchant containing hydrogen peroxide, sulfuric acid, and a polymer to remove that portion of the foil from the substrate.

60. In a circuit board: a substrate, and a copper foil on one side of the substrate having a top surface crystal structure with predominantly (311), (511) and (111) orientations, portions of the copper foil having been removed from the board by etching with an aqueous solution containing hydrogen peroxide, sulfuric acid, and polymer.

61. A circuit board manufactured by the steps of: bonding a copper foil having a top surface crystal structure with predominantly (311), (511) and (111) orientations to a substrate, and exposing a portion of the copper foil to a liquid etchant containing hydrogen peroxide, sulfuric acid, and a polymer to remove that portion of the foil from the substrate.

62. The process of claim 1 wherein the liquid etchant comprises an aqueous solution of hydrogen peroxide, sulfuric acid, an a polymer, and the copper foil is selected to have a top surface crystal structure with predominantly (311) and (511) orientations.

63. The circuit board of claim 4 wherein the liquid etchant comprises an aqueous solution of hydrogen peroxide, sulfuric acid, and a polymer, and the copper foil is selected to have a top surface crystal structure with predominantly (311) and (511) orientations.

64. In a process for manufacturing a circuit board, the steps of: bonding a copper foil having a top surface crystal structure with predominantly (311) and (511) orientations to a substrate, and exposing a portion of the copper foil to a liquid etchant containing hydrogen peroxide, sulfuric acid, and a polymer to remove that portion of the foil from the substrate.

65. In a circuit board: a substrate, and a copper foil on one side of the substrate having a top surface crystal structure with predominantly (311) and (511) orientations, portions of the copper foil having been removed from the board by etching with an aqueous solution containing hydrogen peroxide, sulfuric acid, and a polymer.

66. A circuit board manufactured by the steps of: bonding a copper foil having a top surface crystal structure with predominantly (311) and (511) orientations to a substrate, and exposing a portion of the copper foil to a liquid etchant containing hydrogen peroxide, sulfuric acid, and a polymer to remove that portion of the foil from the substrate.

* * * * *